(12) United States Patent
Kim

(10) Patent No.: US 7,595,211 B2
(45) Date of Patent: Sep. 29, 2009

(54) METHOD OF MANUFACTURING A COMPLEMENTARY METAL OXIDE SILICON IMAGE SENSOR

(75) Inventor: Jin Han Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/615,763

(22) Filed: Dec. 22, 2006

(65) Prior Publication Data

US 2007/0161143 A1    Jul. 12, 2007

(30) Foreign Application Priority Data

Dec. 29, 2005    (KR) ............... 10-2005-0133316

(51) Int. Cl.
*H01L 21/00* (2006.01)
(52) U.S. Cl. .................. 438/57; 438/70; 257/E31.121
(58) Field of Classification Search .............. 438/26, 438/28, 29, 57, 58, 69, 70, 71, 72, 75, 48, 438/98; 257/89, 290, 291, 294, E27.133, 257/E31.121, E33.073, 292, 293, E31.128, 257/E31.127, E31.11
See application file for complete search history.

(56) References Cited

U.S. PATENT DOCUMENTS

| | | | | |
|---|---|---|---|---|
| 6,188,092 B1 * | 2/2001 | Hatano et al. | ............... | 257/229 |
| 6,277,752 B1 * | 8/2001 | Chen | ........................ | 438/692 |
| 6,369,417 B1 * | 4/2002 | Lee | ........................... | 257/294 |
| 6,646,808 B2 * | 11/2003 | Li | ............................ | 359/620 |
| 6,794,215 B2 * | 9/2004 | Park et al. | ................. | 438/69 |
| 6,821,810 B1 * | 11/2004 | Hsiao et al. | ................ | 438/69 |
| 6,946,352 B2 * | 9/2005 | Yaung | ..................... | 438/296 |
| 7,446,386 B2 * | 11/2008 | Eristoff et al. | ............ | 257/440 |
| 2006/0046341 A1 * | 3/2006 | Joon | ......................... | 438/70 |
| 2007/0148805 A1 * | 6/2007 | Kim | .......................... | 438/57 |

FOREIGN PATENT DOCUMENTS

| | | |
|---|---|---|
| CN | 1610078 | 4/2005 |
| KR | 10-2004-0060554 | 7/2004 |
| KR | 10-0504563 | 7/2005 |
| TW | 525223 | 3/2003 |

* cited by examiner

*Primary Examiner*—Khiem D Nguyen
(74) *Attorney, Agent, or Firm*—Sherr & Vaughn, PLLC

(57) ABSTRACT

A method for manufacturing a CMOS image sensor increases the performance of the CMOS image sensor by reducing a peeling phenomenon near a wafer edge and a preventing a circle defect in a pixel region. The method reduces defects in the external appearance of the pad. In order to accomplish the object, there is provided a method for manufacturing a CMOS image sensor, the method including depositing an oxide layer and a nitride layer after forming a pad on a substrate. The pad is exposed and cleaned by etching the oxide layer and the nitride layer. A portion of the oxide layer and the nitride layer over the edge region of the substrate may be etched and removed. A first ashing process, a solvent cleaning process, and a second ashing process may be performed. A pad protection layer is deposited. A hydrogen anneal process is performed. A micro-lens process, a planarization process, and a color filter array process are performed. The pad protection layer over a pad area is removed.

18 Claims, 7 Drawing Sheets

METHOD OF MANUFACTURING A COMPLEMENTARY METAL OXIDE SILICON IMAGE SENSOR

The present application claims priority under 35 U.S.C. 119 and 35 U.S.C. 365 to Korean Patent Application No. 10-2005-0133316 (filed on Dec. 29, 2005), which is hereby incorporated by reference in its entirety.

BACKGROUND

A CMOS image sensor does not follow a typical semiconductor manufacturing process. A hydrogen anneal (sinter) process, for improving a low illumination characteristic, is not performed after forming a passivation oxide layer, but is performed after forming a passivation nitride layer. This causes various problems, which involve a nitride layer susceptible to inter-layer stress in the areas near the edges of a wafer.

Problems of related technologies will be described with reference to FIGS. 1A to 1I. FIG. 1A is a sectional view showing a process in which a passivation oxide layer 120 and a passivation nitride layer 130 are deposited after forming a pad 110. Unlike the main central region of the wafer, the areas near the edges of the wafer have irregular residual layers 100 formed through several photo processes due to a wafer edge treatment in a photo process. The edge area has an inferior adhesive binding due to these irregular residual layers 110. In this state, the hydrogen anneal process, which is a heat treatment process requiring a proper ratio of oxygen gas to nitrogen gas, is performed on the CMOS image sensor. During the heat treatment process, the inter-layer stress of the nitride layer 130 at the edge of the wafer is increased. Fluorine ions included in a fluorinated silicate glass of the residual layer 100 are lifted up. The nitride layer 130 at the edge of the wafer is peeled in the shape of a circle, which is called a wafer edge peeling. In addition, during the heat treatment process, particles peeled from the wafer edge area may move to a pixel region in the wafer.

FIG. 1B shows the wafer edge peeling 140 created after the hydrogen anneal process and particles transferred to the pixel region in the main area of the wafer. Since the transferred particle is circular in shape, the particle is called a circle defect 145.

Referring to FIG. 1C, to remove the circle defect 145, a scrubbing process is performed. A pad area 110 is exposed through a photolithography process. Subsequent cleaning and pad treatment processes include a pad ashing step, a solvent cleaning step, and a final curing step. Although the scrubbing and cleaning processes are performed in order to remove the circle defect 145 prior to the cleaning and pad treatment processes, the circle defect 145 remains. Since the ashing step and the solvent cleaning step are performed during the cleaning process, the external appearance of the pad may be relatively rough and may be not clear.

FIG. 1D shows a state in which a pad protection layer 150 has been deposited. FIG. 1E shows a state in which a color filter array layer 160 has been deposited. FIG. 1F shows a color filter array 165 formed through a color photo process. FIG. 1G shows a planarization layer 170 formed through a photo process. FIG. 1H shows a convex micro-lens 180 which is formed through a thermal reflow process. FIG. 1I shows the pad 110 exposed by etching the pad protection layer 150 to enable a probing test. The final curing step is performed after the ashing step and the solvent cleaning step in the cleaning process. Since the curing step, which is a kind of heat treatment step, is performed when the pad is exposed through solvent cleaning, defects occur in the external appearance of the pad.

SUMMARY

Embodiments relate to a method for manufacturing a complementary metal oxide silicon (CMOS) image sensor, and especially to processes after forming a pad on a metal interconnection layer.

Embodiments relate to a method for manufacturing a CMOS image sensor, which increases the performance of the CMOS image sensor by reducing a peeling phenomenon near a wafer edge and a circle defect in a pixel region. The method reduces defects in the external appearance of the pad.

In order to accomplish the object, there is provided a method for manufacturing a CMOS image sensor, the method including depositing an oxide layer and a nitride layer after forming a pad on a substrate. The pad is exposed and cleaned by etching the oxide layer and the nitride layer. A portion of the oxide layer and the nitride layer over the edge region of the substrate may be etched and removed.

A first ashing process, a solvent cleaning process, and a second ashing process may be performed. A pad protection layer is deposited. A hydrogen anneal process is performed. A micro-lens process, a planarization process, and a color filter array process are performed. The pad protection layer over a pad area is removed.

Ashing time of the second ashing step may be greater than 0% and less than 50% of ashing time of the first ashing step. The pad protection layer includes a plasma enhanced tetra ethyl ortho silicate (PE-TEOS) layer. The thickness of the pad protection layer may be between 300 Å to 500 Å. The micro-lens process comprises a thermal reflow process.

BRIEF DESCRIPTION OF THE DRAWINGS

Example

DETAILED DESCRIPTION

Figure 1A:
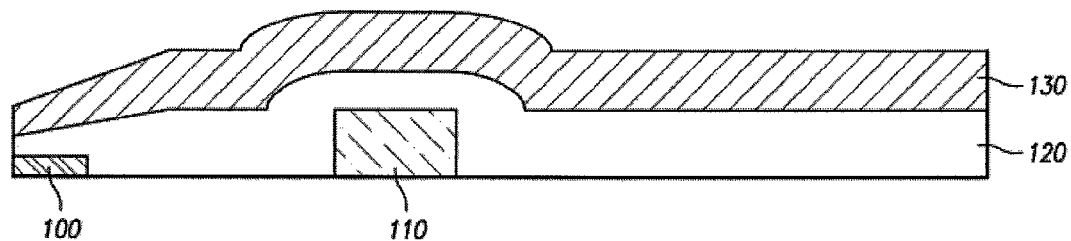
FIGS. 1A to 1I are sectional views showing a method for manufacturing a related CMOS image sensor.
Figure 1B:
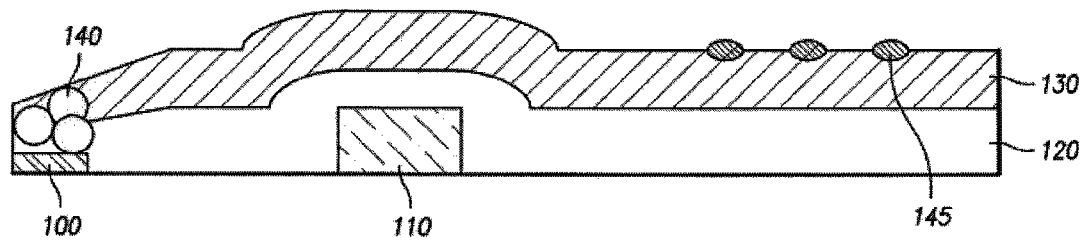
Figure 1C:
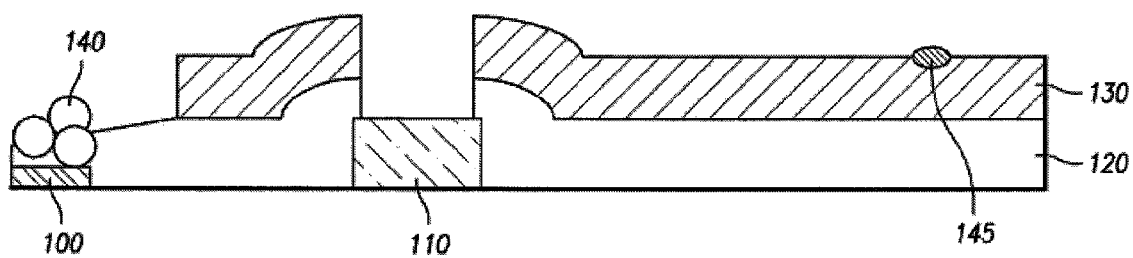
Figure 1D:
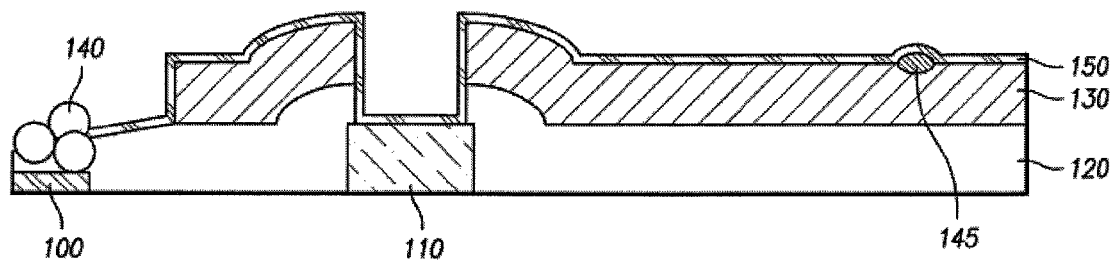
Figure 1E:
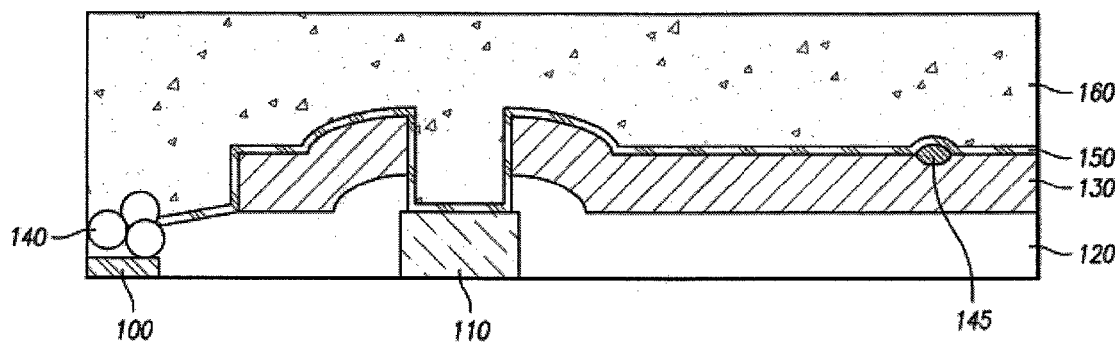
Figure 1F:
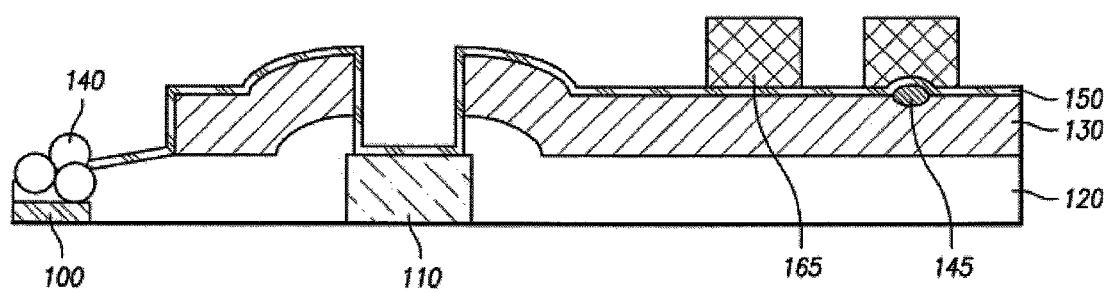
Figure 1G:
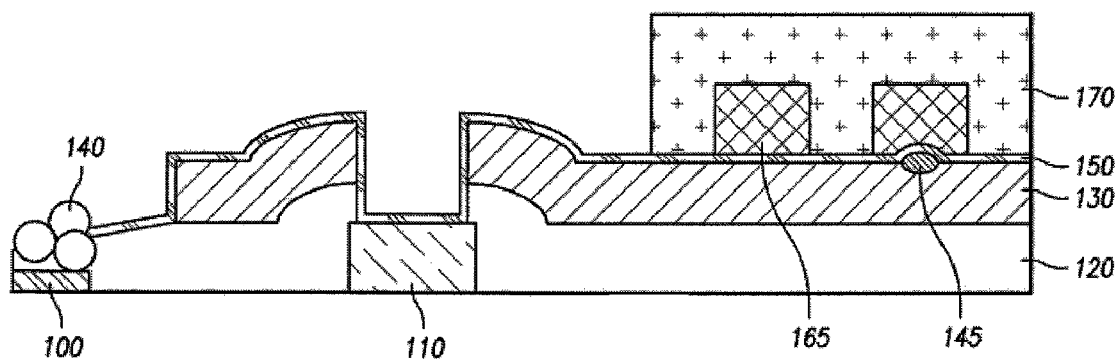
Figure 1H:
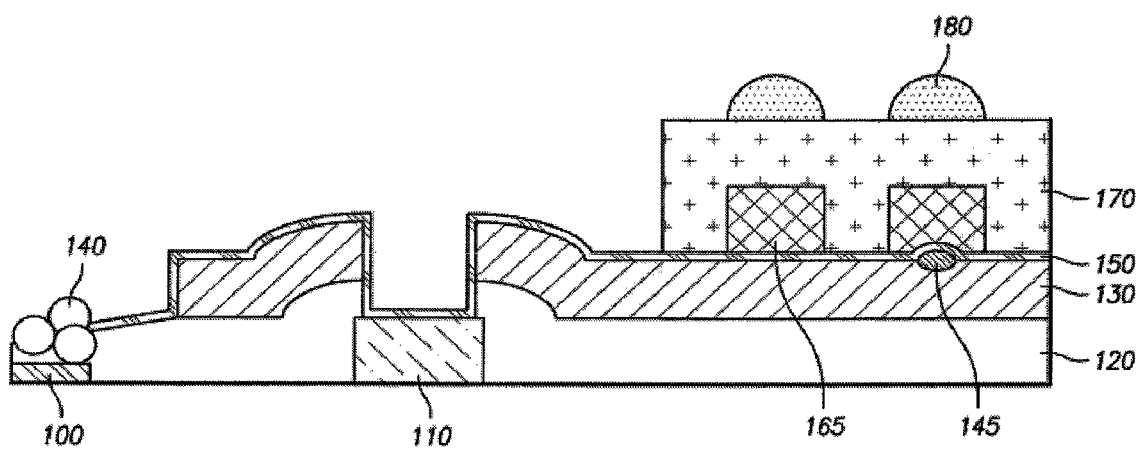
Figure 1I:
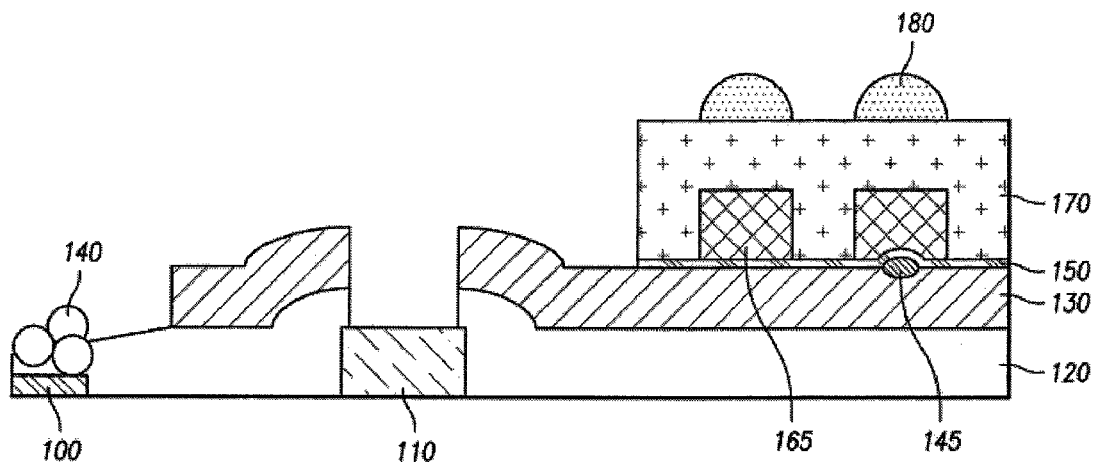
Figure 2A:
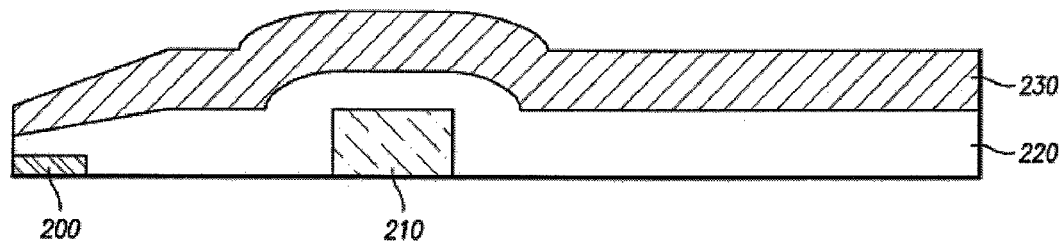
FIGS. 2A to 2H are sectional views showing a method for manufacturing a CMOS image sensor according to embodiments.

FIG. 2A shows a passivation oxide layer 220 and a passivation nitride layer 230, which have been formed after forming a pad 210. Referring to FIG. 2A, after depositing the oxide layer 220, a chemical mechanical planarization (CMP) process is performed, and then the nitride layer 230 is deposited. Irregular residual layers 100 are formed on an edge area of a wafer because the wafer edge is subjected to several photo processes.

Figure 2B:
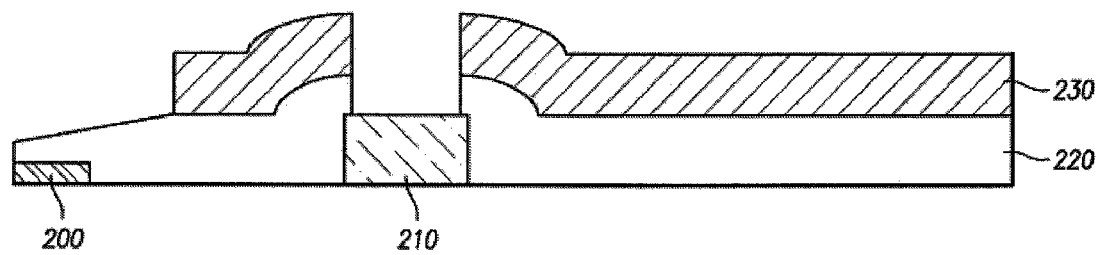

FIG. 2B shows the pad 210 exposed by a photolithography process. The oxide layer 220 and the nitride layer 230 over the edge region of the wafer are etched and removed. A cleaning process is performed on the resultant structure. Unlike the related cleaning process, the cleaning process according to embodiments includes a first ashing step, a solvent cleaning step, and a second ashing step. Unlike the related cleaning process, the final curing step is replaced with an ashing step. The reason for replacing the curing step with the ashing step is to keep the surface of the pad 210 clean by applying a relatively low temperature. The ashing step also takes less time to perform than that of the related final curing step. The ashing step according to embodiments is an ashing step using plasma. The related curing step is performed at a temperature above 350°, so that the surface of the pad is rough and hillocks are easily formed. In contrast, the ashing step is performed at a relatively low temperature of about 250°, so that the surface of the pad has less defects, and the hillocks are less pronounced. In addition, since the second ashing step is performed after the first ashing step, the second ashing step may take less than or equal about half of the time of the first ashing step.

Figure 2C:
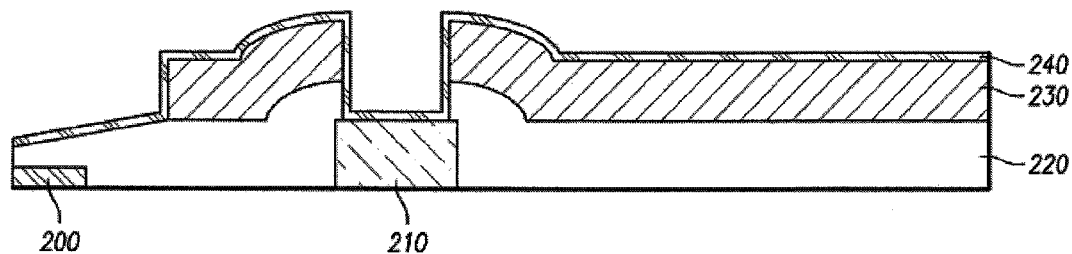

Referring to FIG. 2C, a pad protection layer 240 has been deposited. The pad protection layer 240 may include a PE TEOS layer. The pad protection layer 240 is only 300 Å to 500 Å thick, so that the process for exposing the pad is easier. After depositing the pad protection layer 240, a hydrogen anneal process is performed. In a related technology, the hydrogen anneal process is performed right after forming the oxide layer 220 and the nitride layer 230. According to embodiments, the hydrogen anneal process is performed after depositing the pad protection layer 240, so that it is possible to prevent a peeling phenomenon in an edge area of the wafer. This is because the source of the peeling phenomenon in the nitride layer 230 shown in the edge area of the wafer is completely eliminated. The hydrogen anneal process is performed after removing the oxide layer 220 and the nitride layer 230 in the edge area of the wafer.

The hydrogen anneal process may be performed in a furnace in which hydrogen (H2) and nitrogen (N2) are mixed with each other in a ratio of 10:1 or 10:2. In addition, the hydrogen anneal process may be performed for 20 to 30 minutes at a temperature of 400° C. or more. The surface of silicon has a dangling bond structure with defects caused during an etching process. Hydrogen ions are implanted and buried in the dangling bond structure with defects through the hydrogen anneal process. If a thick nitride layer is deposited, the penetration of hydrogen ions into the nitride layer is largely prevented due to the characteristics of the layer. However, since the nitride layer 230 formed in the pad area is removed when the pad is exposed, the surface of silicon is more effectively repaired. Accordingly, a signal generated in dark conditions (i.e., with no light input to the sensor) caused by free electrons generated in the defected dangling bond structure defects is prevented. The low illumination characteristic of the CMOS image sensor is thereby improved. Since the peeling phenomenon is prevented, a scrubbing process and a defect monitoring process employed in the related technology may be omitted.

Figure 2D:
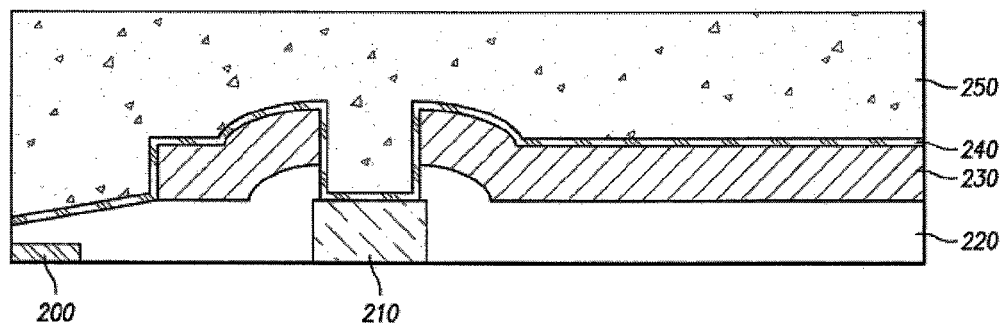
Figure 2E:
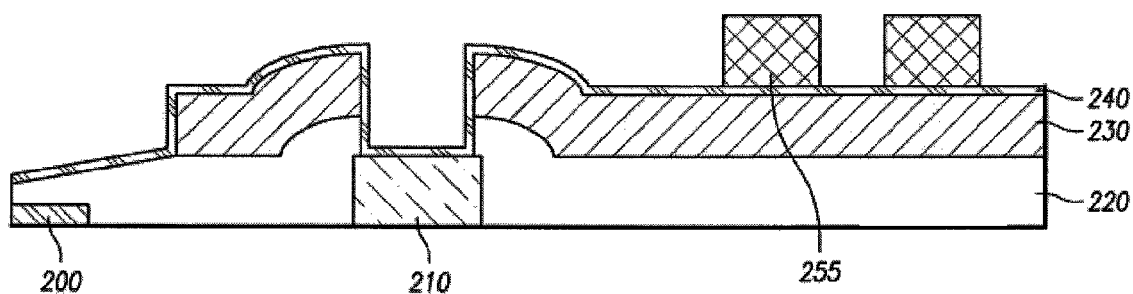
Figure 2F:
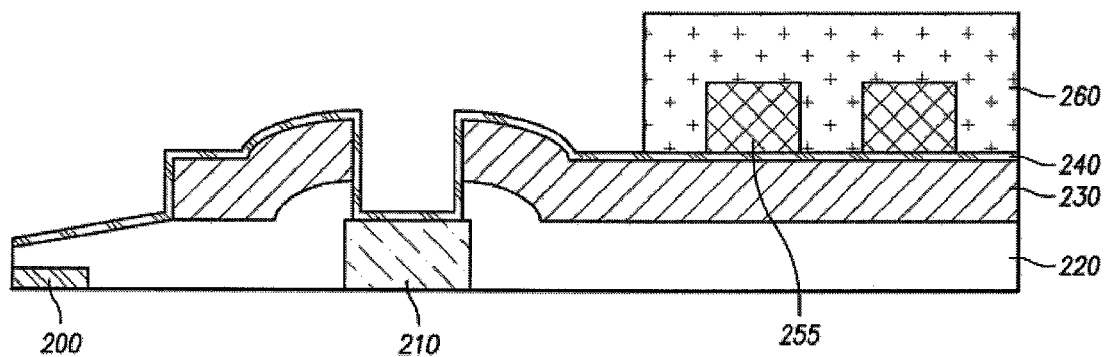
Figure 2G:
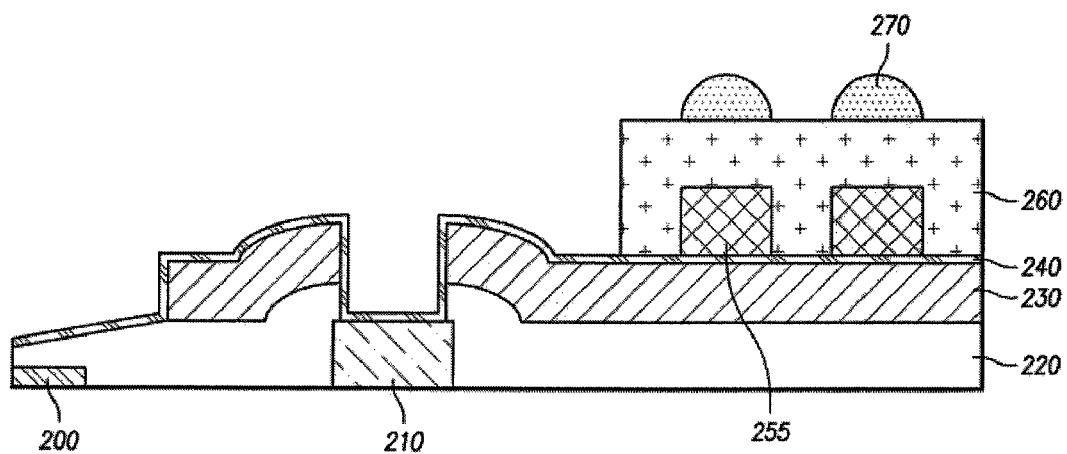
Figure 2H:
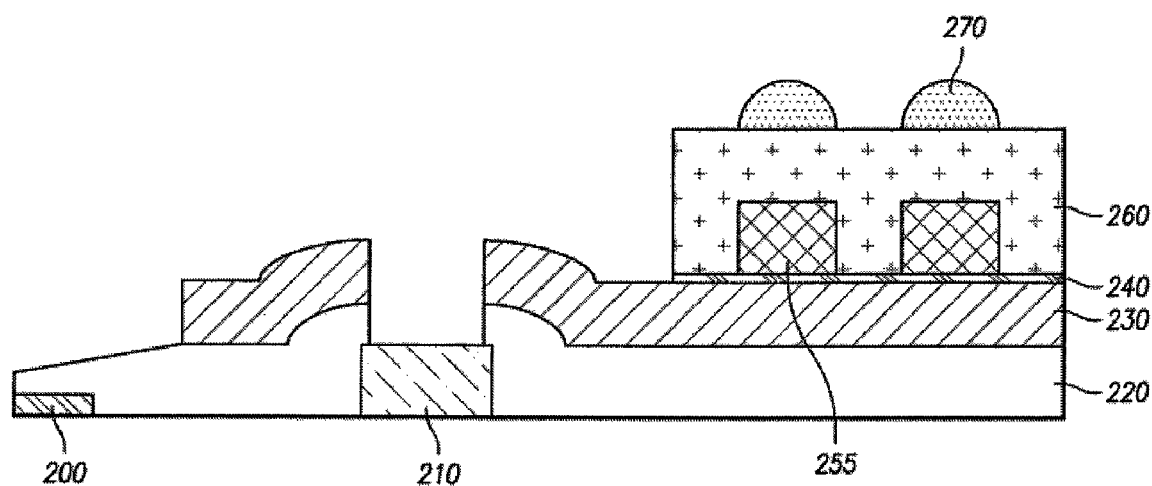

FIG. 2D shows a process of depositing a color filter array layer 250 over the entire surface of the resultant structure. FIG. 2E shows a process of forming a color filter array 255 through a color filter photo process. In addition, FIG. 2F shows a photo process for forming a planarization layer 260. FIG. 2G shows a process of forming a convex micro-lens 270 through a thermal reflow process. FIG. 2H shows the pad 210 exposed by an etching process to enable a probe test.

As described above, according to a method for manufacturing a CMOS image sensor suggested in embodiments, a hydrogen anneal process is performed after forming a pad protection layer, so that a peeling phenomenon of a nitride layer at an edge area of a wafer is prevented. Accordingly, it is possible to prevent circle defects transferred to the inside of a main area of the wafer. In addition, the hydrogen anneal process is performed when the nitride layer of a pad area is removed, so that hydrogen ions more effectively repair the defected surface of a silicon substrate, thereby improving a low illumination characteristic. In addition, as circle defects are prevented, it is possible to omit a scrubbing process and a defect monitoring process performed after the hydrogen anneal process. In addition, unlike a related cleaning process, the external appearance of a pad is protected, and the occurrence of hillocks is prevented by a cleaning process including a first ashing step, a solvent cleaning, and a second ashing step.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a CMOS image sensor comprising:
   forming a pad over a substrate;
   depositing an oxide layer and a nitride layer over the substrate;
   exposing and cleaning the pad by etching the oxide layer and the nitride layer, wherein said cleaning includes a first ashing process, a solvent cleaning process and a second ashing process;
   depositing a pad protection layer;
   performing a hydrogen anneal process;
   performing a micro-lens process, a planarization process, and a color filter array process; and
   removing the pad protection layer over a pad area,
   wherein said exposing and cleaning the pad by etching the oxide layer and the nitride layer comprises etching and removing a portion of the oxide layer and the nitride layer over the edge region of the substrate.

2. The method of claim 1, wherein ashing time of the second ashing step is greater than 0% and less than 50% of ashing time of the first ashing step.

3. The method of claim 1, wherein the pad protection layer includes a plasma enhanced tetra ethyl ortho silicate (PE-TEOS) layer.

4. The method of claim 3, wherein thickness of the pad protection layer is between 300Å to 500 Å.

5. The method of claim 1, wherein said microlens process comprises a thermal reflow process.

6. A method comprising:
   forming a pad over a substrate;
   sequentially forming first and second passivation layers over the pad;
   exposing the pad by performing a first etching process on the first and second passivation layers to thereby remove a portion of the first and second passivation layers over the edge region of the substrate;
   sequentially performing a first ashing process, a solvent cleaning process and a second ashing process on the exposed pad;
   forming a pad protection layer on and contacting the exposed pad after sequentially performing the first ashing process, the solvent cleaning process and the second ashing process;
   performing an annealing process after forming the pad protection layer;
   forming a color filter array layer over pad protection layer;
   forming a micro-lens array on the color filter array layer; and then
   exposing the pad by performing a second etching process.

7. The method of claim 6, wherein the first passivation layer comprises a first oxide layer.

8. The method of claim 6, wherein the second passivation layer comprises a nitride layer.

9. The method of claim 6, wherein the first ashing process and the second ashing process are performed using plasma.

10. The method of claim 9, wherein the first ashing process and the second ashing process are performed at a temperature of about 250° C.

11. The method of claim 6, wherein the pad protection layer comprises a second oxide layer.

12. The method of claim 11, wherein the second oxide layer comprises a plasma enhanced tetra ethyl ortho silicate (PE TEOS) layer.

13. The method of claim 6, wherein the annealing process comprises a hydrogen annealing process.

14. The method of claim 6, wherein the hydrogen annealing process is performed using a mixture of gaseous hydrogen ($H_2$) and gaseous nitrogen ($N_2$).

15. The method of claim 14, wherein the mixture of gaseous hydrogen ($H_2$) and gaseous nitrogen ($N_2$) are mixed in a ratio of 10:1.

16. The method of claim 14, wherein the mixture of gaseous hydrogen ($H_2$) and gaseous nitrogen ($N_2$) are mixed in a ratio of 10:2.

17. The method of claim 14, wherein the hydrogen annealing process is performed for 20 to 30 minutes at a temperature of 400° C. or more.

18. A method comprising:
   forming a first metal layer over a substrate;
   forming a first oxide layer over the first metal layer;
   forming a first nitride layer over the first oxide layer;
   forming a hole extending through the first oxide layer and the first nitride layer to expose the first metal layer by performing a first etching process which removes a portion of the first oxide layer and the first nitride layer over the edge region of the substrate;
   performing a cleaning process on the exposed first metal layer, wherein the cleaning process comprises a first ashing process, a solvent cleaning process and a second ashing process;
   forming a second oxide layer on and contacting the uppermost surface of the first metal layer and the first nitride layer, and the inner sidewalls of the first nitride layer and the first oxide layer at the hole after performing the cleaning process;
   performing a hydrogen anneal process after forming the second oxide layer;
   forming a color filter array layer over the second oxide layer;
   forming a planarization layer over the color filer array and the second oxide layer;
   forming a micro-lens array on the planarization layer; and then
   exposing the first metal layer by performing a second etching process.

* * * * *